United States Patent
Xing et al.

(10) Patent No.: US 12,531,555 B2
(45) Date of Patent: Jan. 20, 2026

(54) DESATURATION PROTECTION OF POWER FIELD-EFFECT TRANSISTOR

(71) Applicant: Infineon Technologies Canada Inc., Ottawa (CA)

(72) Inventors: Nan Xing, Allen, TX (US); Yinglai Xia, Plano, TX (US); Yalong Li, Allen, TX (US); Zhemin Zhang, Allen, TX (US)

(73) Assignee: Infineon Technologies Canada Inc., Ottawa (CA)

( * ) Notice: Subject to any disclaimer, the term of this patent is extended or adjusted under 35 U.S.C. 154(b) by 315 days.

(21) Appl. No.: 18/172,922

(22) Filed: Feb. 22, 2023

(65) Prior Publication Data

US 2024/0283441 A1   Aug. 22, 2024

(51) Int. Cl.
*H03K 17/082* (2006.01)
*H03K 5/24* (2006.01)

(52) U.S. Cl.
CPC ........... *H03K 17/0822* (2013.01); *H03K 5/24* (2013.01)

(58) Field of Classification Search
CPC ............................ H03K 5/24; H03K 17/0822
See application file for complete search history.

(56) References Cited

U.S. PATENT DOCUMENTS

| | | | |
|---|---|---|---|
| 7,336,085 B2* | 2/2008 | Fabbro | H03K 17/18 324/691 |
| 7,768,337 B2 | 8/2010 | Bayerer | |
| 9,444,441 B2* | 9/2016 | Hou | H03K 5/1536 |
| 10,263,412 B2 | 4/2019 | Norling et al. | |
| 10,868,529 B2 | 12/2020 | Huber | |
| 11,342,911 B2* | 5/2022 | Lee | H03K 17/063 |
| 2021/0119627 A1* | 4/2021 | Lee | H02M 7/53871 |
| 2022/0190821 A1* | 6/2022 | Tesu | H03K 17/567 |
| 2022/0352884 A1* | 11/2022 | Onódy | H03K 17/284 |

OTHER PUBLICATIONS

Written Opinion of the International Searching Authority for application No. PCT /IB2024/051733 mailed on May 7, 2024.

* cited by examiner

*Primary Examiner* — Menatoallah Youssef
*Assistant Examiner* — Khareem E Almo
(74) *Attorney, Agent, or Firm* — WORKMAN NYDEGGER

(57) ABSTRACT

Desaturation protection for a power field-effect transistor. The desaturation protection circuit includes the power field-effect transistor and a sense field-effect transistor that each have threshold voltages that are approximately the same. The sense field-effect transistor shares a gate terminal with the power field-effect transistor and shares a drain terminal with the power field-effect transistor. The circuit also includes a comparator having a first input terminal connected to a source terminal of the sense field-effect transistor, and having a second input terminal connected to a voltage source that is an offset voltage below a supply voltage. The circuit also includes a pull-up network configured to cause the output of the comparator to represent a state of whether the sense field-effect transistor is on or off, and can directly drive the turning off of the power transistor.

20 Claims, 5 Drawing Sheets

DESATURATION PROTECTION OF POWER FIELD-EFFECT TRANSISTOR

BACKGROUND OF THE INVENTION

Electronic circuits typically include transistors, which function as electronic switches that regulate or control current flow in portions of the circuit. One type of transistor is a field-effect transistor in which a voltage is applied to a gate terminal to turn the transistor on and off. A semiconductor channel region is disposed between the drain terminal and the source terminal. When the transistor is on, current flows through the semiconductor channel region between the source terminal and the drain terminal. When the transistor is off, lesser or no current flows through the semiconductor channel region between the source terminal and the drain terminal. The gate terminal is disposed over the semiconductor channel region between the source terminal and the drain terminal. Voltage on the gate terminal generates a field that affects whether the semiconductor channel region conducts current—hence the term "field-effect transistor".

Normal transistors are used for amplifying and switching purposes. On the other hand, power transistors are used to convey more substantial current and have higher voltage ratings, and may more typically be used in power supplies, battery charging, and the like. Power transistors can typically operate with currents greater than 1 Amp to as much as a hundred amps or even greater. Power transistors may convey power greater than 1 Watt to as many as hundreds of watts or even greater.

Semiconductor power transistors typically operate in the linear region, in which the current conveyed between the drain and source terminals is approximately proportional to the voltage between the drain and source terminals. In other words, in the linear region, the semiconductor power transistors have a relatively constant on resistance. However, if the transistor enters a saturation region of operation, the drain-to-source voltage $V_{DS}$ can increase dramatically with increases in the drain current $i_D$. In other words, on resistance increases in the saturation region of operation. This means that the power consumed by the field effect transistor (which is $V_{DS} \times i_D$) can surge with increases in the drain current $i_D$ when in the saturation region. Thus, in the saturation region, excessive heat may be generated within the power field-effect transistor, thereby reducing the life of the power transistor, or potentially even immediately destroying the power transistor.

Desaturation protection is a process for protecting semiconductor power transistors such that the semiconductor power transistor is shut down if there is risk that the semiconductor power transistor has entered the saturation region. Conventionally, to perform desaturation protection, a drain current or voltage of the power transistor is sensed, and the sensed value is compared to a preset threshold value. If the sensed value exceeds the preset threshold value, the power transistor is turned off.

The subject matter claimed herein is not limited to embodiments that solve any disadvantages or that operate only in environments such as those described above. Rather, this background is only provided to illustrate one example technology area where some embodiments described herein may be practiced.

SUMMARY OF THE INVENTION

At least some embodiments described herein relate to a circuit that is equipped with desaturation protection. The circuit includes a power field-effect transistor having a first threshold voltage, and a sense field-effect transistor having a second threshold voltage that approximates the first threshold voltage. The sense field-effect transistor shares a gate terminal with the power field-effect transistor and shares a drain terminal with the power field-effect transistor. The circuit also includes a comparator having a first input terminal connected to a source terminal of the sense field-effect transistor, and having a second input terminal connected to a voltage source that is an offset voltage below a supply voltage.

The circuit also includes a pull-up network configured to (when the sense field-effect transistor is on) allow a source voltage at the source terminal of the sense field-effect transistor to track a drain voltage at the drain terminal of the sense field-effect transistor when the sense field-effect transistor is on, such that the voltage at the first input terminal of the comparator is lower than the voltage at the second input terminal of the comparator. The pull-up network is also configured to (when the sense field-effect transistor is off), pull a voltage of the source terminal of the sense field-effect transistor towards the supply voltage such that the voltage at the first input terminal of the comparator is higher than the voltage at the second input terminal of the comparator. The output of the comparator thus represents a state of whether the sense field-effect transistor is on or off, and can directly drive the turning off of the power transistor.

Since the second threshold voltage of the sense field-effect transistor (looking from gate to drain) approximates the first threshold voltage of the power field-effect transistor (looking from gate to source), and because the gate terminal and drain terminal of each of the sense field-effect transistor and power field-effect transistor are shared, the on-off state of the sense field-effect transistor correlates to whether or not the power field-effect transistor is actually operating in the saturation region. Thus, the output of the comparator also represents a saturation status that is based on the actual threshold voltage of the power field-effect transistor. Accordingly, the principles described herein more accurately detect entry of the power field-effect transistor into the saturation region, thus preventing inaccurate detections that can result from deviations from transistor to transistor, and regardless of temperature effects. This more accurate detection improves performance of the power field-effect transistor since the power field-effect transistor is less likely to be falsely shut down due to an inaccurate detection of saturation.

Furthermore, the sense field-effect transistor and thereafter the comparator react quickly to detect entry into the saturation region. Thus, the power field-effect transistor may be more quickly turned off in response to that detection. This reduces or even eliminates damage to the power field-effect transistor due to entry into the saturation region, because the power field-effect transistor experiences less of the voltage surge.

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

In order to describe the manner in which the advantages and features of the systems and methods described herein can be obtained, a more particular description of the embodiments briefly described above will be rendered by reference to specific embodiments thereof which are illustrated in the appended drawings. Understanding that these drawings depict only typical embodiments of the systems and methods described herein, and are not therefore to be considered to be limiting of their scope, certain systems and methods will be described and explained with additional specificity and detail through the use of the accompanying drawings in which.

DETAILED DESCRIPTION OF THE INVENTION

At least some embodiments described herein relate to a circuit that is equipped with desaturation protection for a power field-effect transistor. As the term is used herein, a "power field-effect transistor" or a "power FET" is a field-effect transistor that has a channel region that is capable of conveying over one watt of power. The concept of desaturation protection will first be described with respect to FIG. 1.

Figure 1:
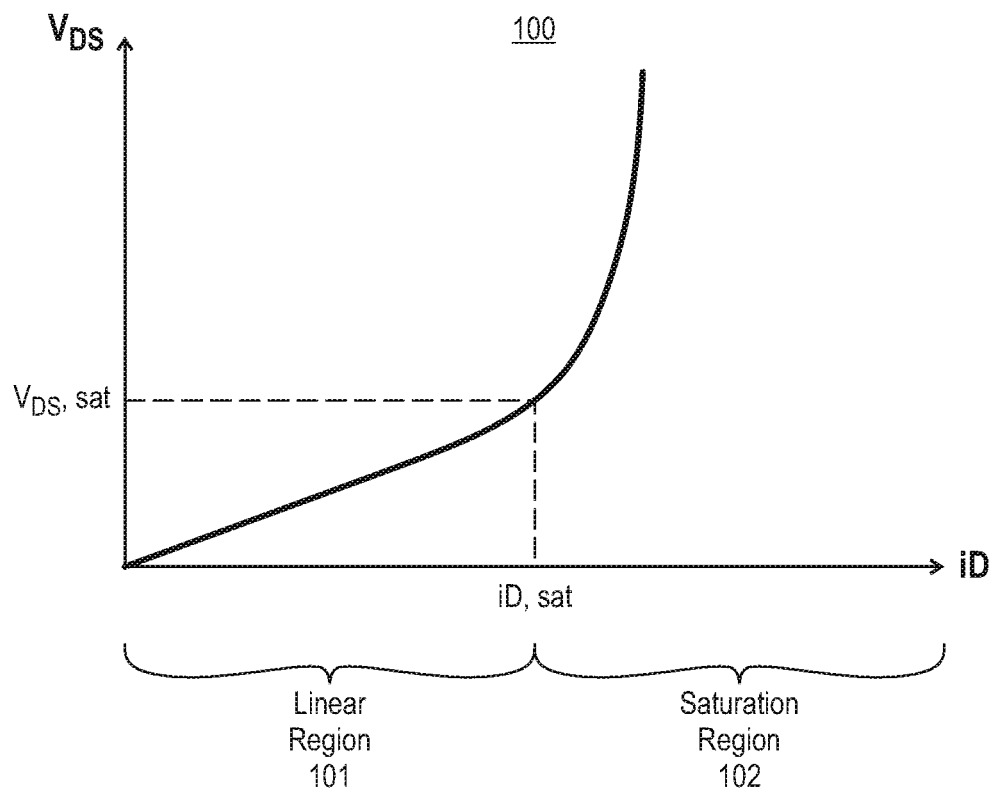
FIG. 1 illustrates a plot of drain-to-source voltage $V_{DS}$ (plotted in the vertical axis) vs drain current $i_D$ (plotted on the horizontal axis) for a power field-effect transistor, and is used to explain the linear region and saturation region of a power transistor.

FIG. 1 illustrates a plot 100 of drain-to-source voltage $V_{DS}$ (plotted in the vertical axis) vs drain current $i_D$ (plotted on the horizontal axis) for a power field-effect transistor. In the linear region 101, the drain current $i_D$ is approximately proportional to the drain-to-source voltage $V_{DS}$. The slope of the drain-to-source voltage $V_{DS}$ over the drain current $i_D$ in the linear region 101 is referred to as the "on resistance" (or $R_{DSON}$). As the drain-to-source voltage $V_{DS}$ increases beyond a saturation voltage $V_{DS,sat}$, and as the drain current $i_D$ increases beyond a saturation current $i_{D,sat}$, the field-effect transistor exits the linear region 101 and enters the saturation region 102. In the saturation region 102, the drain-to-source voltage $V_{DS}$ increases dramatically with the drain current $i_D$, resulting in a rapid increase in power ($V_{DS} \times i_D$) transferred through the transistor. This likewise results in a dramatic increase in heat generated within the power field-effect transistor. Without some protection from this heat, the power field-effect transistor will be damaged or destroyed. Such protection is termed "desaturation protection".

As a side note, FIG. 1 shows the change in slope of the voltage-current curve as abruptly changing between the linear region 101 and the saturation region 102. However, a real voltage-current curve has a more gradual transition between the linear region 101 and the saturation region 102. Nevertheless, the general principle is illustrated in FIG. 1. That is, the power transistor operates substantially as a resistor in the linear region 101. On the other hand, the power transistor operates substantially as a current source in the saturation region 102, but with substantial heat generated within the power transistor.

Figure 2:
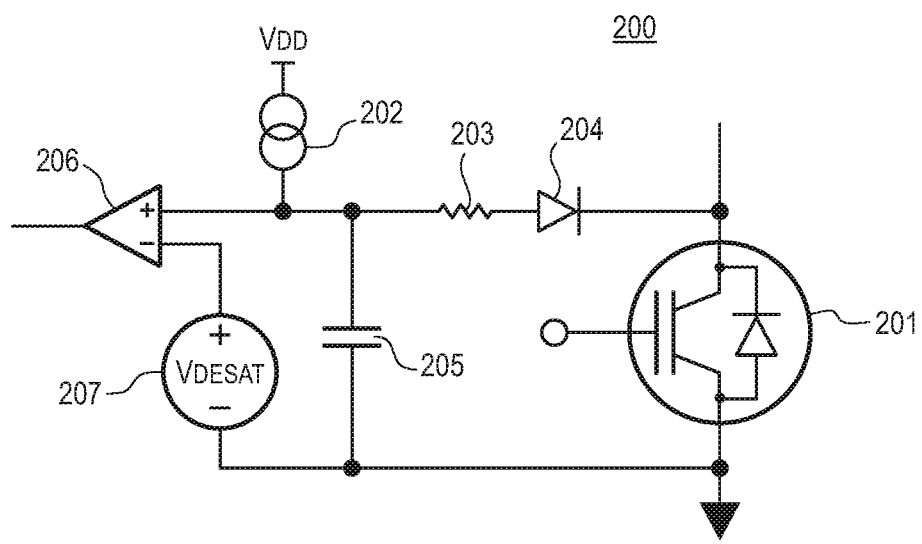
FIG. 2 illustrates a conventional circuit that provides desaturation protection for a power field-effect transistor, in accordance with the prior art.

FIG. 2 illustrates a conventional circuit 200 that provides desaturation protection for a power field-effect transistor, in accordance with the prior art. The circuit 200 includes a power field-effect transistor 201, a current source 202, a resistor 203, a diode 204, a capacitor 205, a comparator 206, and a voltage source 207. The source terminal of the power field-effect transistor 201 is connected to ground. The voltage source 207 applies a voltage $V_{DESAT}$ to the negative terminal of the comparator 206.

When, the power field-effect transistor 201 is on, the voltage at the drain of the power field-effect transistor is small since the resistance through the power field-effect transistor is small. Accordingly, current flows from the current source 202 through the resistor 203 and the diode 204. The voltage at the positive terminal of the comparator 206 is thus likewise small (smaller than $V_{DESAT}$). This results in the comparator 206 outputting a low signal indicating no desaturation protection. On the other hand, as the voltage at the drain terminal of the power field-effect transistor 201 rises (due to potential entry into the saturation region), the voltage at the positive input terminal of the comparator 206 will exceed $V_{DESAT}$, resulting in the comparator 206 outputting a positive signal indicating desaturation protection is to be applied.

However, different power field-effect transistors may have different threshold voltages depending on temperature and processing deviations. Accordingly, the actual $V_{DS,sat}$ of a power FET varies from part-to-part (e.g., due to process variations), and is temperature dependent. A pre-set comparison voltage $V_{DESAT}$ does not track these device-to-device variations nor temperature deviations, and thus the pre-set value is of $V_{DESAT}$ is selected to provide a margin to accommodate these variations, based on a lowest $V_{DS,sat}$ for all devices. Thus, the comparison voltage $V_{DESAT}$ is selected to be small to thereby ensure that desaturation protection is always provided. However, this will result in many false positive detections of saturation, thereby over-triggering desaturation protection even when the transistor has not entered the saturation region.

Figure 3:
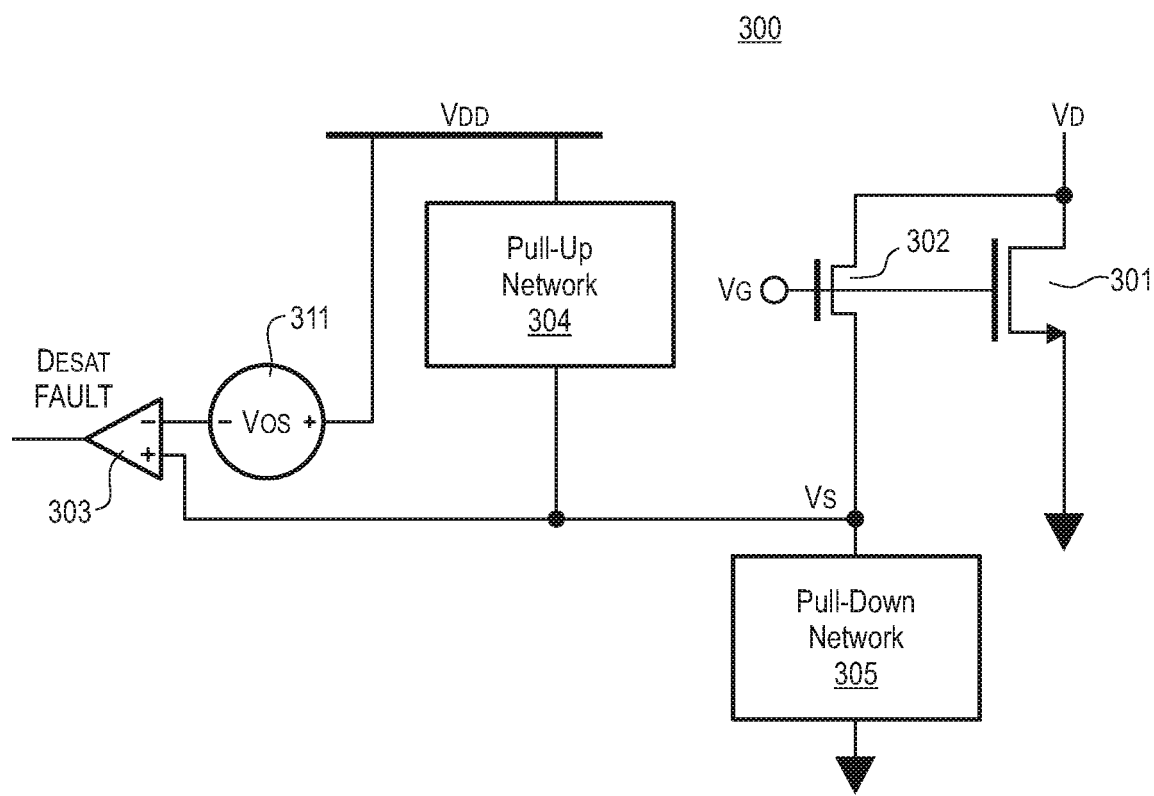
FIG. 3 illustrates a circuit that provides desaturation protection for a power field-effect transistor, in accordance with the principles described herein.

FIG. 3 illustrates a circuit 300 that provides desaturation protection for a power field-effect transistor, in accordance with an example embodiment of the present inventive concept. The circuit 300 provides desaturation protection for a power field-effect transistor 301. In this description and in the claims, a "power" field-effect transistor is a field-effect transistor that switches a power of more than one watt. However, many power field-effect transistors can convey power into the hundreds of watts, or even greater. In one embodiment, the power field-effect transistor 301 has a drain voltage $V_D$ of greater than 100 volts when off. The principles described herein are not limited to the size of the power field-effect transistor. the sense field-effect transistor being a high electron mobility transistor (HEMT) type transistor, the power field-effect transistor also being a HEMT type transistor.

The principles described herein are not limited to the power field-effect transistor 301 being any particular type of field-effect transistor, as long as the transistor's gate-to-source threshold approximates its gate-to-drain threshold. As examples only, the power field-effect transistor 301 may be a Gallium Nitride (GaN) High Electron Mobility Transistor (HEMT) type transistor, a Silicon Carbide (SiC) HEMT, or any other transistor type capable of operating as a power field-effect transistor.

The circuit 300 also includes a sense field-effect transistor 302. The sense field-effect transistor 302 shares a gate terminal with the power field-effect transistor 301. For instance, a gate voltage $V_G$ is illustrated as being applied to the gate terminal of both the sense field-effect transistor 302 and the power field-effect transistor 301. Furthermore, the sense field-effect transistor 302 shares a drain terminal with the power-field effect transistor 301. For instance, in FIG. 3, a drain voltage $V_D$ is illustrated as being applied to the drain terminal of both the sense field-effect transistor 302 and the power field-effect transistor 301. In the illustrated embodiment, the source terminal of the power field-effect transistor 301 is grounded.

The sense field-effect transistor 302 has a threshold voltage (looking from gate to drain) (also called herein a "second threshold voltage") that approximates a threshold voltage (looking from gate to source) (also called herein a "first threshold voltage") of the power field-effect transistor 301. The sense field-effect transistor 302 is on when the gate voltage $V_G$ is the second threshold voltage greater than the drain voltage $V_D$. Likewise, the power field-effect transistor 301 is on when the gate voltage $V_G$ is the first threshold voltage greater than the drain voltage $V_D$. In this context, since the first threshold voltage and the second threshold voltage are approximately the same, the sense field-effect transistor 302 is on when the power field-effect transistor 301 is operating in the linear region with a low drain voltage $V_D$.

While the first threshold voltage and the second threshold voltage are preferably the same, perfect matching of threshold voltages is a practical impossibility. In one embodiment, the second threshold voltage is within (plus or minus) 0.5 volts of the first threshold voltage. In another embodiment, the second threshold voltage is within (plus or minus) 0.2 volts of the first threshold voltage. In yet another embodiment, the second threshold voltage is within (plus or minus) 0.1 volts of the first threshold voltage.

In some embodiments, to effect a similar threshold voltage for each transistor, the sense field-effect transistor 302 and the power field-effect transistor 301 may each be semiconductor devices of the same type. For example, if the power field-effect transistor 301 is a HEMT type transistor, the sense field-effect transistor 302 would also a HEMT type transistor. As specific examples, if the power field-effect transistor 301 is a GaN HEMT type transistor, the sense field-effect transistor 302 would also be a GaN HEMT type transistor; and if the power field-effect transistor 301 is a SiC HEMT type transistor, the sense field-effect transistor 302 would also be a SiC HEMT type transistor. Furthermore, if the power field-effect transistor 301 is an enhancement mode transistor, the sense field-effect transistor 302 would also be an enhancement mode transistor.

In addition, to effect a similar threshold voltage for each transistor, the sense field-effect transistor 302 and the power field-effect transistor 301 may even be fabricated using the same processing steps. However, it is preferred that the sense field-effect transistor 302 be smaller than the power field-effect transistor 301. As an example, the sense field-effect transistor 302 may be a finger transistor. In some embodiments, a gate width of the sense field-effect transistor 302 may be less than 1 percent (or preferably within 0.2 percent) of a gate width of the power field-effect transistor 301. In one embodiment, the gate width of the sense field-effect transistor 302 is only 0.1 percent of the power field-effect transistor 301. Such a relatively small sense-field effect transistor 302 allows for lower power detection of saturation.

The circuit 300 also includes a comparator 303 having a first input terminal connected to a source terminal of the sense field-effect transistor 302. For example, in FIG. 2, the positive input terminal of the comparator 303 is connected to the source terminal of the sense field-effect transistor 302. The comparator 303 also has a second input terminal connected to a voltage source that is an offset voltage $V_{OS}$ (voltage source 311) below a supply voltage $V_{DD}$. For instance, the comparator 303 has a negative input terminal connected to a voltage source having a voltage value of $V_{DD}$ minus $V_{OS}$.

When the source voltage of the sense field-effect transistor 302 is below a comparison voltage ($V_{DD}$ minus $V_{OS}$ in FIG. 3), the comparator 303 outputs a low signal (indicative of there being no desaturation protection needed). On the other hand, when the source voltage of the sense field-effect transistor 302 is above the comparison voltage value $V_{DD}$ minus $V_{OS}$, the comparator 303 outputs a high signal (which triggers desaturation protection).

The offset voltage $V_{OS}$ may be a fixed voltage, although the principles described herein are not limited to that embodiment. As an example, the offset voltage $V_{OS}$ may be at least 1 volt. In yet another embodiment, the offset voltage $V_{OS}$ is at least 0.5 volts. In yet another embodiment, the offset voltage $V_{OS}$ is at least 0.2 volts. The offset voltage $V_{OS}$ should be large enough that the pull-up network 304 (described below) is capable of pulling the source voltage $V_S$ above the comparison voltage ($V_{DD}$ minus $V_{OS}$) when the sense field-effect transistor 302 is off.

The circuit 100 also includes a pull-up network 304. When the sense field-effect transistor 302 is on, the power field-effect transistor 301 has likely entered the saturation region. This likelihood is greater the closer the threshold voltages of the transistors 301 and 302 match. When the power field-effect transistor 301 is on and operating in the linear region, the drain voltage $V_D$ is close to ground because of the low on resistance of the power field-effect transistor 301. With $V_D$ being low, and with the sense field-effect transistor 302 also being on, the source voltage $V_S$ of the sense field-effect transistor 302 is also quite low. The pull-up network 304 is weak enough that it has minimal impact on this voltage when the sense field-effect transistor 302 is on. Thus, when the sense field-effect transistor 302 is on, the pull-up network 304 allows the source voltage $V_S$ at the source terminal of the sense field-effect transistor 302 to track the drain voltage $V_D$ at the drain terminal of the sense field-effect transistor 302. In this condition, the voltage at the first (e.g., positive) input terminal of the comparator 303 is lower than the voltage at the second (e.g., negative) input terminal of the comparator 303.

On the other hand, when the sense field-effect transistor 302 is off, the pull-up network is strong enough to pull the source voltage $V_S$ upwards towards the supply voltage $V_{DD}$. The source voltage $V_S$ continues to rise until the voltage at the first input terminal of the comparator 303 is higher than the voltage at the second input terminal of the comparator. In this condition, the comparator 303 outputs a high signal. Thus, the comparator 303 outputs a high signal when the sense field-effect transistor 302 is off, which is indicative of the power field-effect transistor operating in the saturation region. Thus, the high signal output by the comparator 303 may be used to drive desaturation protection by, for example, turning the power field-effect transistor 301 off.

The output of the comparator 303 thus represents a state of whether the sense field-effect transistor 302 is on or off, and thus whether the power field-effect transistor 301 is operating in the saturation region. This is true regardless of temperature variations if the sense field-effect transistor 302 and the power field-effect transistor 301 have similar temperature dependencies. Furthermore, this is true regardless of processing variations that can occur from part to part, if the sense field-effect transistor 302 and the power field-effect transistor are fabricated in the same processing steps.

Since the second threshold voltage of the sense field-effect transistor 302 approximates the first threshold voltage of the power field-effect transistor 301, and because the gate terminal and drain terminal of the sense field-effect transistor and power field-effect transistor are shared, the on-off state of the sense field-effect transistor correlates to whether or not the power field-effect transistor is actually operating in the saturation region. Thus, the output of the comparator also represents a saturation status that is based on the actual threshold voltage of the power field-effect transistor. Accordingly, the principles described herein more accurately detect entry of the power field-effect transistor into the saturation region, thus preventing inaccurate detections that can result from deviations from transistor to transistor. This more accurate detection improves performance of the power field-effect transistor since the power-field effect transistor is less likely to be shut down due to a false detection of saturation.

Furthermore, the sense field-effect transistor and thereafter the comparator react quickly to detect entry into the saturation region. Thus, the power field-effect transistor may be more quickly turned off in response to that detection. This reduces or even eliminates damage to the power field-effect transistor due to entry into the saturation region, because the power field-effect transistor experiences less of the voltage surge. Fast wide bandgap semiconductor power devices, such as Gallium Nitride (GaN) and Silicon Carbide (SiC) can be very susceptible to such surges. This is particularly true of enhancement mode (e-mode) GaN HEMT devices, which have a saturation current that is much lower than other types of power semiconductor transistors such as normally-on GaN HEMTs, SiC MOSFETs, Si MOSFET and Si IGBTs. The thermal mass of a e-mode lateral GaN HEMT is small. For example, during overcurrent, an e-mode lateral GaN HEMT may heat up very quickly and have a survival time of only 300 nanoseconds (ns) to 500 ns. The principles described herein are suitable to provide desaturation protection even that quickly, while reducing incidence of false positive detection of saturation.

Referring to FIG. 3, the circuit 300 further may optionally include a pull-down network 305 connected to the source terminal of the sense field-effect transistor 302. The pull-down network 305 helps ensure that the source voltage $V_S$ remains below the comparison voltage ($V_{DD}$ minus $V_{OS}$) when the power field-effect transistor is off. However, the pull-down network 305 is weak enough to allow the pull-up network 304 to dominate and pull the source voltage $V_S$ towards the supply voltage $V_{DD}$ when the sense field-effect transistor 302 is off.

Figure 4:
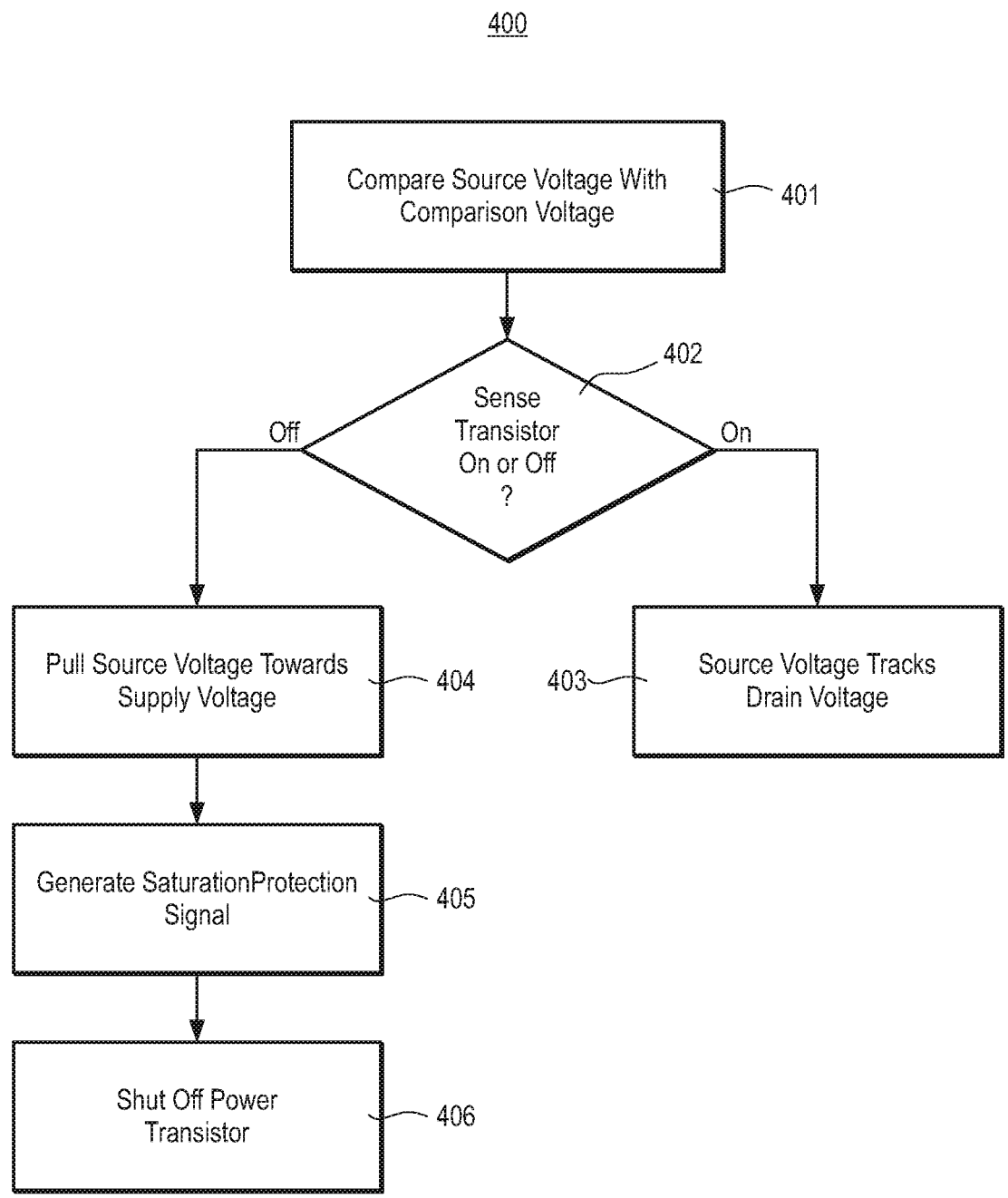
FIG. 4 illustrates a flowchart of a method for providing desaturation protection of a power field-effect transistor, in accordance with the principles described herein.

FIG. 4 illustrates a flowchart of a method 400 for providing desaturation protection of a power field-effect transistor, in accordance with the principles described herein. The method 400 is performed in a circuit that includes a sense field-effect transistor having a second threshold voltage that approximates a first threshold voltage of the power field-effect transistor, the sense field-effect transistor sharing a gate terminal with the power field-effect transistor and sharing a drain terminal with the power field-effect transistor. As an example, the method 400 may be continuously performed within the circuit 300 of FIG. 3. The method 400 includes comparing a source voltage of a source terminal of the sense field-effect transistor with a comparison voltage that is an offset voltage below a supply voltage (act 401). Then, action taken depends on whether the sense field-effect transistor is on or off (decision block 402).

When the sense field-effect transistor is on ("On" in decision block 402), the source voltage at the source terminal of the sense field-effect transistor tracks a drain voltage at the drain terminal of the sense field-effect transistor such that the source voltage is lower than the comparison voltage (act 403).

On the other hand, when the sense field-effect transistor is off ("Off" in decision block 402), the source voltage of the source terminal of the sense field-effect transistor is pulled towards the supply voltage such that the source voltage is higher than the comparison voltage (act 404). When the source voltage is higher than the comparison voltage, a saturation detection signal is generated (act 405). In response to that saturation detection signal, the power field-effect transistor is shut off (act 406).

Figure 5:
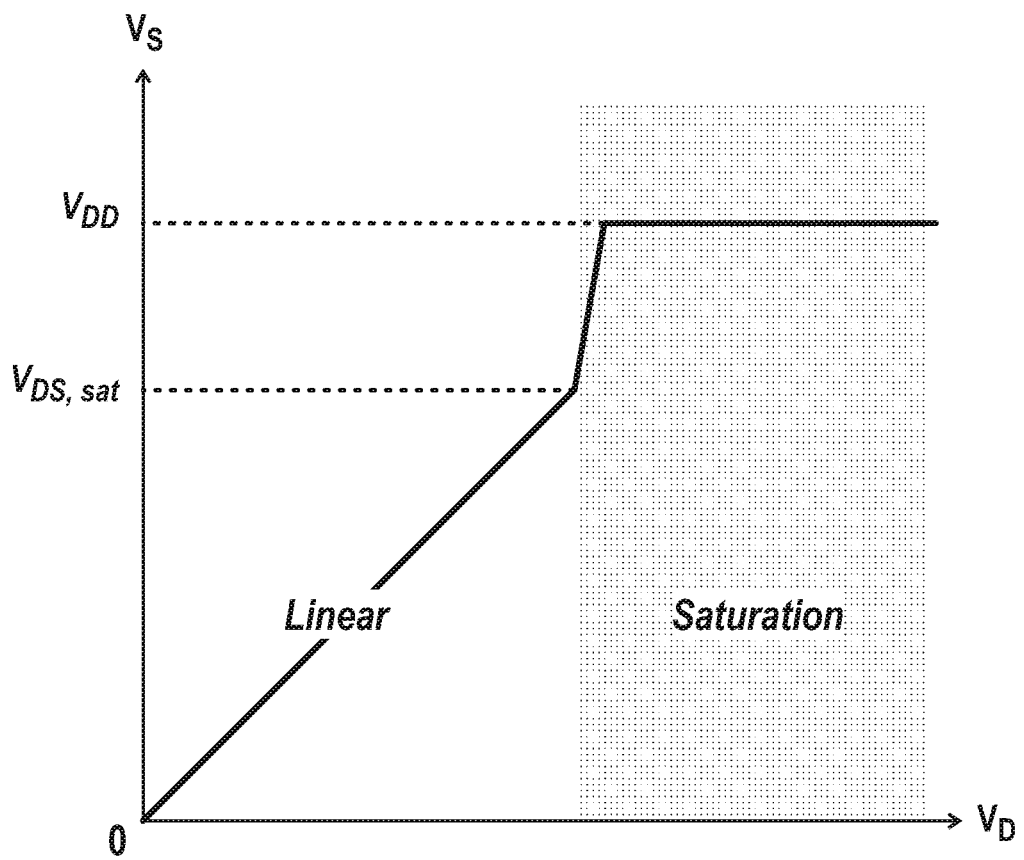
FIG. 5 shows a plot of source voltage $V_S$ vs. drain voltage $V_D$ of the sense field-effect transistor to illustrate operation of the desaturation protection circuit.

FIG. 5 shows a plot 500 of source voltage $V_S$ vs. drain voltage $V_D$ of the sense FET to illustrate operation of the desaturation protection circuit. The threshold voltage $V_T$ of the sense field-effect transistor 301 and the power field-effect transistor are approximately equal. The equivalent resistance $R_{equivalent}$ of the pull up network 304 is much greater than the on resistance $R_{dson}$ of the sense field-effect transistor. In the linear region indicated in FIG. 5, the gate voltage $V_G$ is greater than $V_D$-$V_T$, so that the sense field-effect transistor fully on. When the power field-effect transistor enters saturation, $V_G$ becomes less than $V_D$-$V_T$, and the pull up network pulls the source voltage $V_S$ all the way up to $V_{DD}$. When the source voltage equals the power supply voltage $V_{DD}$, the comparator outputs a DESAT fault signal to the controller to turn-off the power FET. This arrangement provides accurate saturation detection independent of process and temperature variations. There is no need for margin or oversizing.

Figure 6:
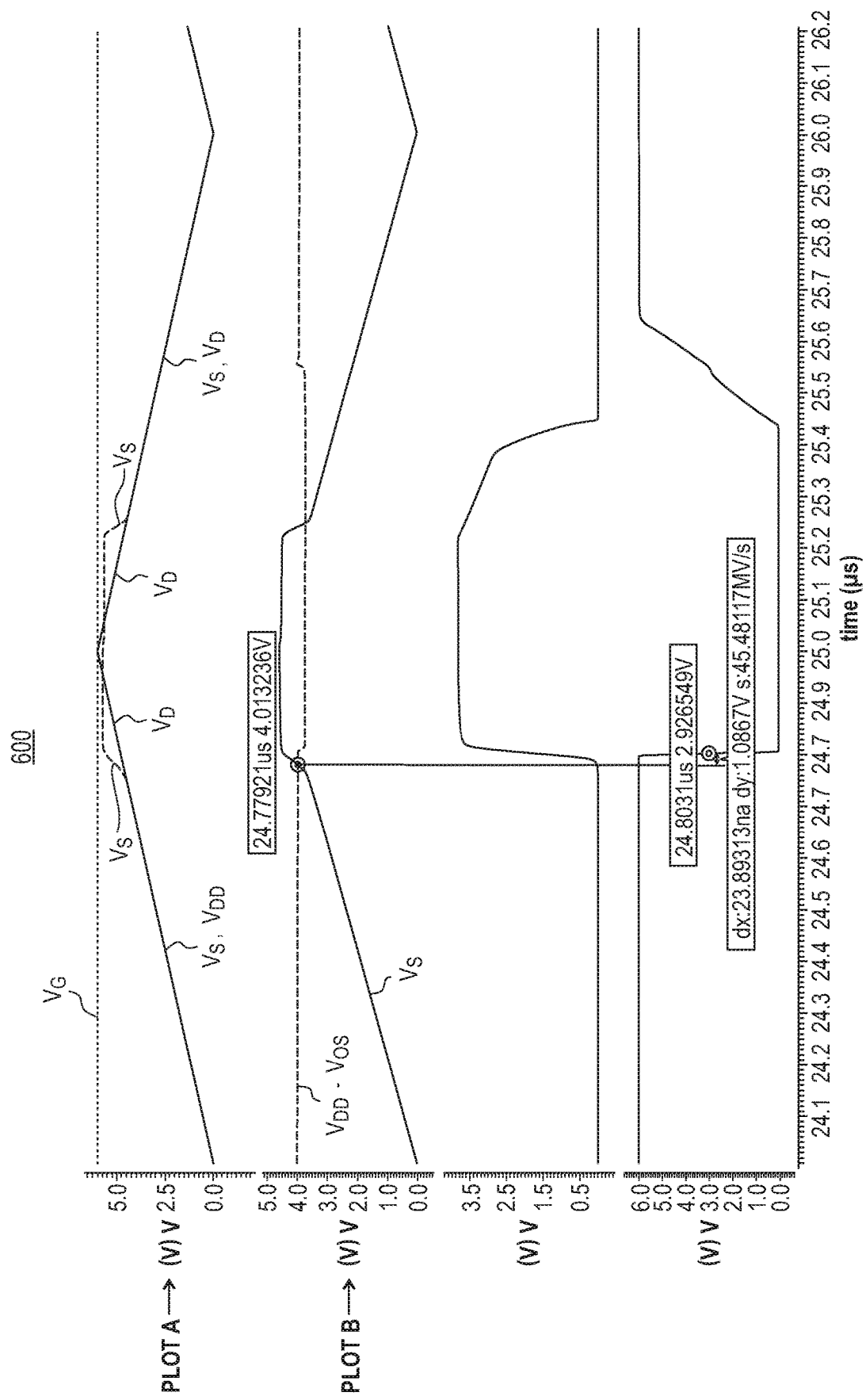
FIG. 6 shows some simulated voltage waveforms from a simulation of the desaturation protection circuit.

FIG. 6 shows some simulated voltage waveforms 600 from a simulation of the desaturation protection circuit. Plot A shows $V_D$ (represented as a dashed), $V_S$ (represented as a solid line) and $V_G$ (represented as a dotted line) over time. In this case, the gate voltage $V_G$ is equal to the supply voltage $V_{DD}$, which are both 6 volts. Where $V_D$ and $V_S$ are congruent, they are both represented by a solid line). The drain current $V_D$ is permitted to rise evenly from 0 volts at time 24 microseconds (μs) to 6 volts at time 25 μs. Until about time 24.77921 μs, the sense-field effect transistor is operating in the linear region, and thus $V_D$ and $V_S$ are congruent. However, at around time 24.77921 μs, $V_D$ becomes within a threshold voltage of the gate voltage $V_G$. Accordingly, at around time 24.77921 μs, the power field-effect transistor 301 begins to saturation, and thus $V_S$ jumps quickly to the supply voltage $V_{DD}$. The comparator will then output a DSAT fault signal. From time 25 μs to time 26 μs, the drain voltage $V_D$ is reduced evenly from 6 volts back down to zero volts. Once the drain voltage $V_D$ reduces to be greater than a threshold voltage below the gate voltage $V_G$, the sense field-effect transistor turns back on thereby equalizing $V_D$ and $V_S$.

Plot B compares waveforms for $V_S$ (represented as a solid line) with $V_{DD}$-$V_{OS}$ (represented as a dashed line). When the power field effect transistor enters saturation, and $V_S$ begins to increase and rises above $V_{DD}$, $V_{DD}$-$V_{OS}$ begins to decrease, triggering a first stage of the comparator to output a fault signal, e.g., 3.5V, and an output second stage of the comparator to switch from 6V to 0V to initiate turn-off. For completeness, plot C shows the comparator first stage output and plot D shows the comparator second stage output.

In this simulation, saturation begins at 24.7791 µs and the comparator output fault signal occurs at 24.8031 µs, which is about 4 nanoseconds (ns) (i.e., 4 billionths of a second). This is fast enough to provide desaturation protection for wide-bandgap power FETs such as e-mode GaN HEMTs. This arrangement provides accurate saturation detection independent of process and temperature variations.

Although the subject matter has been described in language specific to structural features and/or methodological acts, it is to be understood that the subject matter defined in the appended claims is not necessarily limited to the described features or acts described above, or the order of the acts described above. Rather, the described features and acts are disclosed as example forms of implementing the claims.

The present disclosure may be embodied in other specific forms without departing from its essential characteristics. The described embodiments are to be considered in all respects only as illustrative and not restrictive. All changes which come within the meaning and range of equivalency of the claims are to be embraced within their scope.

When introducing elements in the appended claims, the articles "a," "an," "the," and "said" are intended to mean there are one or more of the elements. The terms "comprising," "including," and "having" are intended to be inclusive and mean that there may be additional elements other than the listed elements.

What is claimed:

1. A circuit comprising:
a power field-effect transistor having a first threshold voltage;
a sense field-effect transistor having a second threshold voltage that approximates the first threshold voltage, the sense field-effect transistor sharing a gate terminal with the power field-effect transistor and sharing a drain terminal with the power field-effect transistor, a source terminal of the power field-effect transistor connected to a fixed low voltage supply, a source terminal of the sense field-effect transistor being disconnected from the source terminal of the power field-effect transistor;
a comparator having a first input terminal connected to a source terminal of the sense field-effect transistor, and having a second input terminal connected to a voltage source that is an offset voltage below a supply voltage; and
a pull-up network configured to 1) when the sense field-effect transistor is on, allow a source voltage at the source terminal of the sense field-effect transistor to track a drain voltage at the drain terminal of the sense field-effect transistor such that the voltage at the first input terminal of the comparator is lower than the voltage at the second input terminal of the comparator, and 2) when the sense field-effect transistor is off, pull a voltage of the source terminal of the sense field-effect transistor towards the supply voltage such that the voltage at the first input terminal of the comparator is higher than the voltage at the second input terminal of the comparator, an output of the comparator thereby representing a state of whether the sense field-effect transistor is on or off.

2. The circuit in accordance with claim 1, the sense field-effect transistor and the power field-effect transistor each being semiconductor devices that were fabricated using the same semiconductor processing steps, but with the sense field-effect transistor being smaller than the power field-effect transistor.

3. The circuit in accordance with claim 2, a gate width of the sense field-effect transistor being less than 1 percent of a gate width of the power field-effect transistor.

4. The circuit in accordance with claim 2, a gate width of the sense field-effect transistor being less that 0.2 percent of a gate width of the power field-effect transistor.

5. The circuit in accordance with claim 1, the second threshold voltage being within 0.5 volts of the first threshold voltage.

6. The circuit in accordance with claim 1, the second threshold voltage being within 0.2 voltages of the first threshold voltage.

7. The circuit in accordance with claim 1, the second threshold voltage being within 0.1 volts of the first threshold voltage.

8. The circuit in accordance with claim 1, the power field-effect transistor configured to operate with a drain voltage of greater than 100 volts.

9. The circuit in accordance with claim 1, further comprising:
a pull-down network connected to the source terminal of the sense field-effect transistor, the pull-up network configured to dominate over the pull-down network when the pull-up network is in operation.

10. The circuit in accordance with claim 1, the offset voltage being at least 0.2 volts.

11. The circuit in accordance with claim 1, the offset voltage being at least 0.5 volts.

12. The circuit in accordance with claim 1, the sense field-effect transistor being a high electron mobility transistor (HEMT) type transistor, the power field-effect transistor also being a HEMT type transistor.

13. The circuit in accordance with claim 12, the sense field-effect transistor being a GaN HEMT type transistor, the power field-effect transistor also being a GaN HEMT type transistor.

14. The circuit in accordance with claim 12, the sense field-effect transistor being a SiC HEMT type transistor, the power field-effect transistor also being a SiC HEMT type transistor.

15. The circuit in accordance with claim 12, the sense field-effect transistor being an enhancement mode HEMT type transistor, the power field-effect transistor also being an enhancement mode HEMT type transistor.

16. A method for providing desaturation protection of a power field-effect transistor in a circuit that includes a sense field-effect transistor having a second threshold voltage that approximates a first threshold voltage of the power field-effect transistor, the sense field-effect transistor sharing a gate terminal with the power field-effect transistor and sharing a drain terminal with the power field-effect transistor, a source terminal of the power field-effect transistor connected to a fixed low voltage supply, a source terminal of the sense field-effect transistor being disconnected from the source terminal of the power field-effect transistor, the method comprising:
applying a fixed low voltage to the source terminal of the power field-effect transistor comparing a source voltage of source terminal of the sense field-effect transistor with a comparison voltage that is an offset voltage below a supply voltage that is higher than the fixed low voltage;
when the sense field-effect transistor is on, allowing a source voltage at the source terminal of the sense field-effect transistor to track a drain voltage at the drain terminal of the sense field-effect transistor such that the source voltage is lower than the comparison voltage; and when the sense field-effect transistor is off, pulling the source voltage of the source terminal of the sense field-effect transistor towards the supply voltage such that the source voltage is higher than the comparison voltage.

17. The method in accordance with claim 16, further comprising:

when the source voltage is higher than the comparison voltage generating a signal representing a saturation detection signal.

18. The method in accordance with claim 17, further comprising:

in response to generating the saturation detection signal, shutting off the power field-effect transistor.

19. The circuit in accordance with claim 1, the fixed low voltage supply being ground.

20. The method in accordance with claim 16, the fixed low voltage supply being ground.

* * * * *